United States Patent
Iwasaki

(10) Patent No.: US 7,667,222 B2
(45) Date of Patent: Feb. 23, 2010

(54) PHASE CHANGE MEMORY FEATURING FERROMAGNETIC LAYERS IN CONTACT WITH PHASE CHANGE LAYER

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 881 days.

(21) Appl. No.: 11/214,866

(22) Filed: Aug. 31, 2005

(65) Prior Publication Data

US 2006/0087921 A1    Apr. 27, 2006

(30) Foreign Application Priority Data

Oct. 21, 2004   (JP) ............... 2004-306307

(51) Int. Cl.
*H01L 41/04* (2006.01)
*H01L 41/06* (2006.01)
*H01L 45/00* (2006.01)

(52) U.S. Cl. .............. 257/5; 257/616; 257/E45.002

(58) Field of Classification Search .......... 257/2, 257/3, 4, 5, E31.029, E45.002; 365/148, 365/163, 168
See application file for complete search history.

(56) References Cited

U.S. PATENT DOCUMENTS

| | | | | |
|---|---|---|---|---|
| 5,825,046 A | * | 10/1998 | Czubatyj et al. | ............... 257/2 |
| 7,488,968 B2 | * | 2/2009 | Lee | ............... 257/4 |
| 2007/0018202 A1 | * | 1/2007 | Zhu | ............... 257/213 |

OTHER PUBLICATIONS

"Applied Physics", vol. 1, No. 5 (2002), pp. 562-565.

* cited by examiner

*Primary Examiner*—Lynne A. Gurley
*Assistant Examiner*—Andrew O. Arena
(74) *Attorney, Agent, or Firm*—Antonelli, Terry, Stout & Kraus, LLP.

(57) ABSTRACT

A phase change memory comprises a phase-change recording layer for recording information through changing between a crystal phase and an amorphous phase; and a means for applying a tensile strain onto the phase-change recording layer, thereby providing the memory having high reliability, as well as, high tolerance or durability against repetitive rewriting operation.

12 Claims, 11 Drawing Sheets

PHASE CHANGE MEMORY FEATURING FERROMAGNETIC LAYERS IN CONTACT WITH PHASE CHANGE LAYER

BACKGROUND OF THE INVENTION

The present invention relates to a phase change memory, enabling to record, delete, rewrite and reproduce information, with using the phase change.

As is described in the following Non-Patent Document 1, in accordance with a phase change recording method, write-in is conducted for information, with using the fact that a material of the recoding film or layer thereof causes the phase change, i.e., between the crystal phase and the amorphous phase, while read-out is conducted through determination on made on whether it is the crystal phase or the amorphous phase. In case when using a recording film material, such as, chalcogenide (for example, a material group of $GeSb_xTe_y$), which is mostly applied in this method, because of a low stability of the amorphous phase, it is sometimes crystallized with the passage of time. Such the drawback is more serious, in particular, under the environment or circumstance of high temperature. And, as is also described in the document mentioned above, in case where the coefficient is large, in particular, about voluminous variation between crystal phase/amorphous phase, there is also a drawback that the characteristics thereof are deteriorated due to repetition of the rewriting. In this document, it is described that the higher in the lattice defect density of the composition, the smaller in the voluminous variation thereof, and therefore that it is high in the tolerance or durability against the repetition. Further, as was also described in the Non-Patent document 1, an important problem to be solved is an increase of a rewriting speed, by speeding up the speed of phase changing.

Non-Patent Document 1: "Applied Physics" Vol. 1, No. 5 (2002), from page 562 to page 565.

BRIEF SUMMARY OF THE INVENTION

A first object, according to the present invention, is to provide a phase change memory, having high reliability. And, a second objection, according to the present invention, is to provide a phase change memory, being stable in the amorphous condition thereof. Also, a third objection, according to the present invention, is to provide a phase change memory, having high tolerance against the repetition of rewritings. Further, according to the present invention, a fourth object is to provide a phase change memory, being fast in the speed of rewriting.

As a result of zealous studies made by the inventors, for obtaining a means for improving the stability of the amorphous phase of a film or layer for phase-change recording, they found out that it is effective to bring an amorphous material having atomic arrangement, being similar to that of the amorphous phase of the phase-change recording film or layer, to be in contact with that phase-change recording film or layer.

Also, the inventors makes the fact clear that, when trying to improve the tolerance against repetition with applying a composition having high density of the lattice defects, while utilizing the knowledge of the Non-Patent Document 1 mentioned above therein, but the regularity is deteriorated in the atomic arrangement under the crystal condition (i.e., deleting condition), as an adverse reaction due to the fact that the lattice defects are much therein; therefore it is difficult to distinguish it from the amorphous phase. Then, the inventors found out that it is effective of letting the recording film or layer to have tensile or stretching strain therein, as a result of the zealous studies for obtaining a means to improve the tolerance against repetition, but without applying such the composition having high density of lattice defects. Further, they found that it is possible to obtain an effect of increasing the rewriting speed, by letting the recording film or layer the tensile or stretching strain therein.

For accomplishing such the objects, according to the present invention, there is provided a phase change memory, comprising the following constructions; i.e., a phase-change recording film or layer for recording information therein through altering or changing between a crystal phase and an amorphous phase; and a means for applying a tensile or stretching strain onto the said phase-change recording film or layer.

And, according to the present invention, it is possible to provide a phase change memory, having high reliability. Also, according to the present invention, it is possible to provide a phase change memory, being stable in the amorphous condition thereof. Also, according to the present invention, it is possible to provide a phase change memory, having high tolerance against the repetition of rewritings. Further, according to the present invention, it is possible to provide a phase change memory, being fast in the speed of rewriting.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, embodiments according to the present invention will be fully explained by referring to the attached drawings.

Embodiment 1

Figure 1:
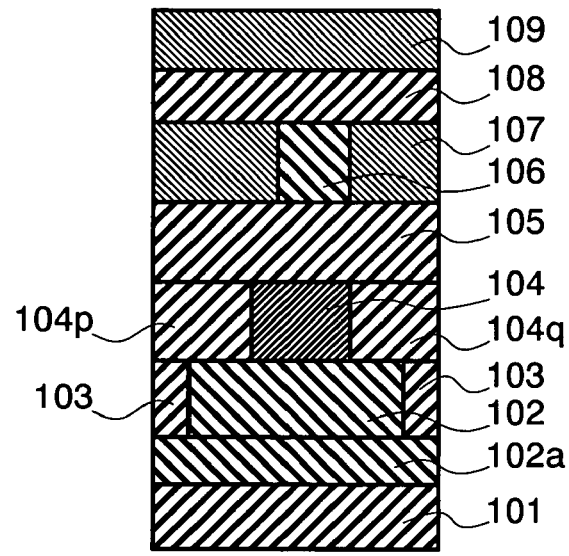
FIG. 1 is a cross-sectional view of a principle portion of a phase change memory, according to a first embodiment of the present invention.

Next, the cross-sectional structure of a principle portion is shown in FIG. 1, first of all, in particular, within the phase change memory, according to the first embodiment of the present invention. Upon a silicon substrate 101 are built up layers, i.e., forming a wiring film or layer 102a, a lower electrode layer 102, an insulation layer 103, a phase-change recording layer 104, a ferromagnetic layer 104p, a ferromagnetic layer 104q, an upper electrode layer 105, a wiring layer 106, an insulating layer 107, a wiring layer 108, and an insulating layer 109, in that sequence thereof. Those are formed with applying the method, such as, the spattering, the chemical vapor deposition (CVD), or the plating, for example. The phase-change recording layer 104 includes at least two (2) elements therein, as the constituent ones thereof, which are selected from Ge, Sb and Te, and it is mainly composed from $GeSb_2Te_4$, $Ge_2Sb_2Te_5$, $Ge_6Sb_2Te_9$, or $ZnSb_xTe_y$, $ZnGe_xTe_y$, $ZnGe_{xSb_y}Te_z$, $GeSb_xTe_y$, for example. In this case, there can be obtained an advantage that $GeSb_2Te_4$, $Ge_2Sb_2Te_5$, $Ge_6Sb_2Te_9$ are fast in the phase change speed. On the other hand, $ZnSb_xTe_y$, $ZnGe_xTe_y$, $ZnGe_xSb_yTe_z$, $GeSb_xTe_y$, have an advantage of being strong in the mechanical strength thereof. As a material of the lower electrode layer 102, it is preferable to apply an amorphous material, having the atomic arrangement same to that within the amorphous phase of the phase-change recording layer 104, from a viewpoint for stabilizing the amorphous phase of the phase-change recording layer 104. For example, $TiSi_xN_y$ or $TaSi_xN_y$ is the amorphous material having the atomic arrangement same to that within the amorphous phase of the phase-change recording layer 104. Since $TiSi_xN_y$ or $TaSi_xN_y$ is an amorphous material, which has an averaged distance of about 0.3 nm between the closest atoms within a surface of a contact interface thereof, and also since the amorphous phase of the main constituent material (for example, $GeSb_2Te_4$, $Ge_2Sb_2Te_5$, $Ge_6Sb_2Te_9$, or $ZnSb_xTe_y$, $ZnGe_xTe_y$, $ZnGe_xSb_yTe_z$, $GeSb_xTe_y$) has an averaged distance of about 0.3 nm between the closest atoms within a surface of a contact interface thereof, therefore the amorphous phase of the recording layer 104 is stabilized when $TiSi_xN_y$ or $TaSi_xN_y$ is in contact with the phase-change recording layer 104. For showing that effect, analysis is made on activation energy, being necessary for the amorphous phase of the phase-change recording layer 104 to be crystallized, through a molecular dynamic simulation. The molecular dynamic simulation, as is described on page 4877 of "Journal of Applied Physics", Vol. 54 (1983), for example, is a method for calculating the position of each atom at each of times, through solving the Newton's equation of motion, upon the basis of a force acting upon each of atoms through a potential between the atoms, which is calculated out. However, within the present embodiment can be obtained a relationship, which will be mentioned later, through calculation of an interaction between elements of different kinds, by introducing the charge transfer into the method of molecular dynamics mentioned above.

The steps for making analysis upon the activation energy are as follows, being necessary for the amorphous phase of the recording layer 104 to be crystallized, through the method of molecular dynamics. Thus, an initial condition of the recording layer 104 is obtained as being the amorphous phase; i.e., the time up to when it is changed into the crystal phase (i.e., the crystallizing time), for example, in the cases of 600° C. and 700° C. Thereafter, as is executed normally, those results are displayed in the form of the Arrhenius plots, so as to draw a straight line connecting between two (2) points indicative of the results at two (2) points of temperature. From an inclination of the straight line, it is possible to calculate out the activation energy.

Figure 2:
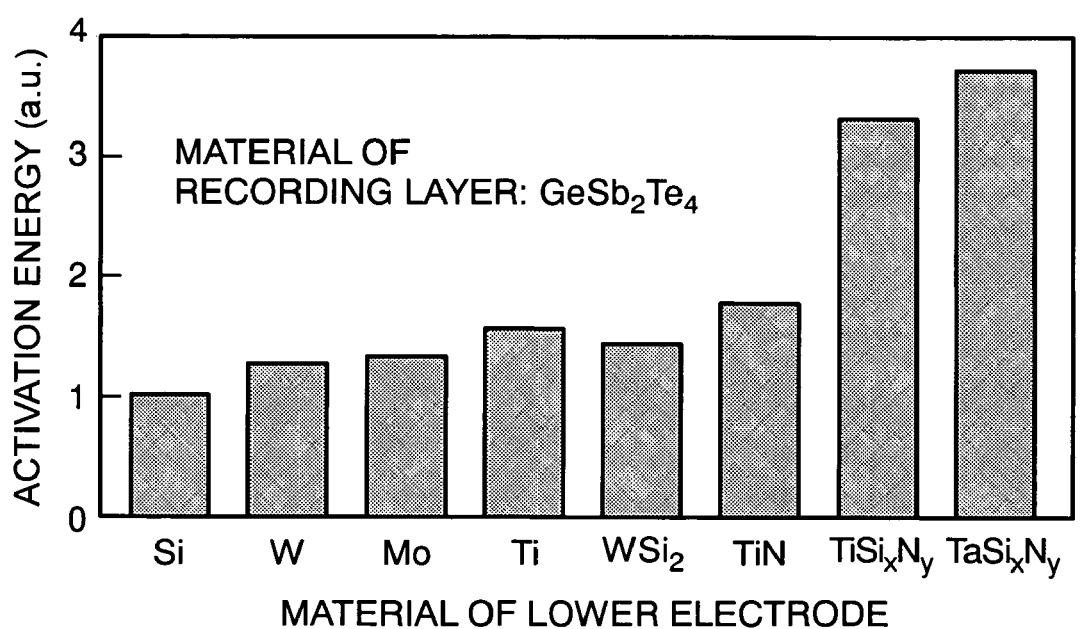
FIG. 2 is a graph for showing a manner of how activation energy, for changing from amorphous phase into crystal phase, depends on a material of a lower electrode, in particular, in case when applying $GeSb_2Te_4$ as a recoding film 104.

A manner how the activation energy depends on the main constituent material of the lower electrode 102 is shown in FIG. 2, in particular, in case when $GeSb_2Te_4$ is applied as the main constituent material of the phase-charge recording layer 104. It can be seen that the activation energy is remarkably large, when applying $TiSi_xN_y$ or $TaSi_xN_y$, being an amorphous material having the averaged distance of about 0.3 nm between the closest atoms within the surface of contact interface thereof, as a material of the lower electrode, and that the amorphous phase of the phase-change recording layer 104 is stabilized. However, in this case, $TiSi_xN_y$ is a material of TiN being added with Si at 1 at. %. Also, $TaSi_xN_y$ is a material of TaN being added with Si at 1 at. %.

Figure 3:
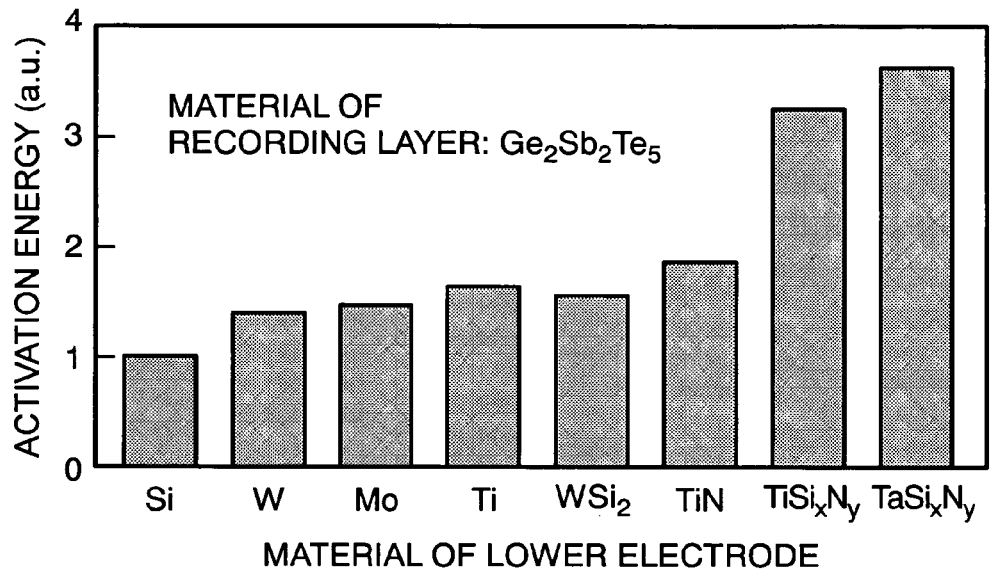
FIG. 3 is a graph for showing a manner of how activation energy, for changing from amorphous phase into crystal phase, depend on a material of a lower electrode, in particular, in case when applying $Ge_2Sb_2Te_5$ as the recoding film 104.

A manner how the activation energy depends on the main constituent material of the lower electrode 102 is shown in FIG. 3, in particular, in case when $Ge_2Sb_2Te_5$ is applied as the main constituent material of the phase-charge recording layer 104. In the similar manner to the case shown in FIG. 2, it can be seen that the activation energy is remarkably large, when applying $TiSi_xN_y$ or $TaSi_xN_y$, being the amorphous material having the averaged distance of about 0.3 nm between the closest atoms within the surface of contact interface thereof, as a material of the lower electrode, and that the amorphous phase of the phase-change recording layer 104 is stabilized. Although not shown the results thereof, however it is confirmed that the similar effect to those shown in FIGS. 2 and 3 can be obtained, when applying the element selected from Ge, Sb and Te to be the main constituent material, and including at least two (2) elements therein, selected from Ge, Sb and Te, as well.

Figure 4:
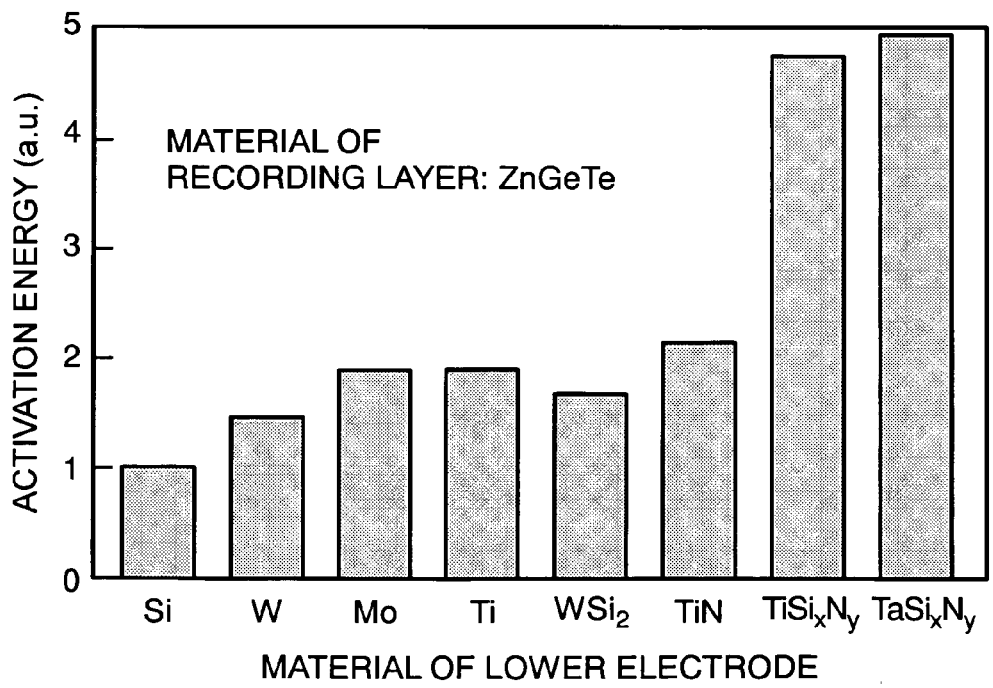
FIG. 4 is a graph for showing a manner of how activation energy, for changing from amorphous phase into crystal phase, depends on a material of a lower electrode, in particular, in case when applying ZnGeTe as the recoding film 104.
Figure 5:
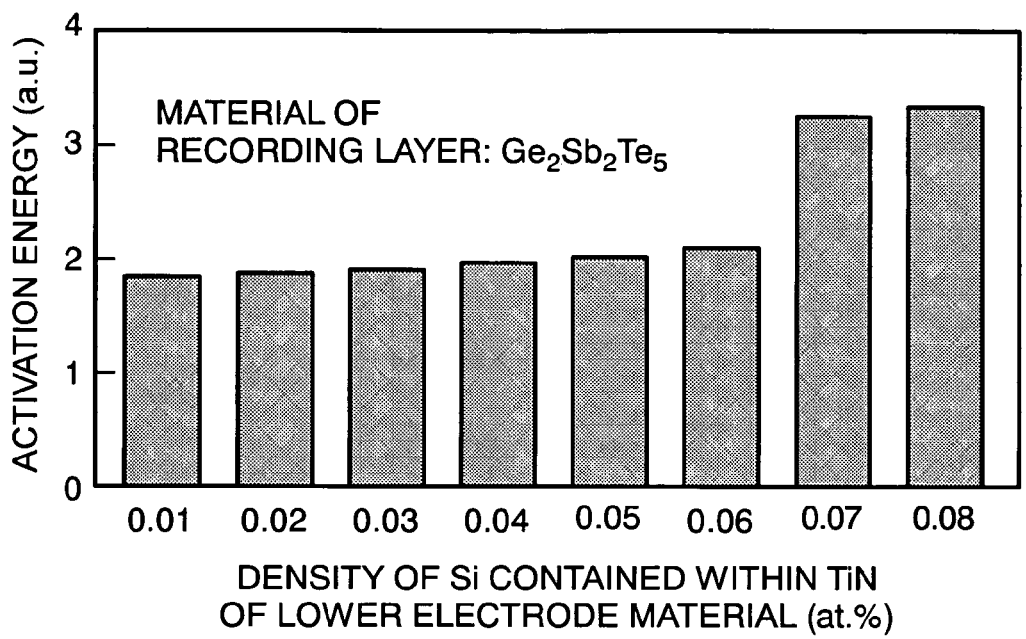
FIG. 5 is a graph for showing a manner of how activation energy, for changing from amorphous phase into crystal phase, depends on Si density within TiN, in case when applying $Ge_2Sb_2Te_5$ as a recoding film 104 and TiN as a lower electrode 102, in particular, within a low density region thereof.
Figure 6:
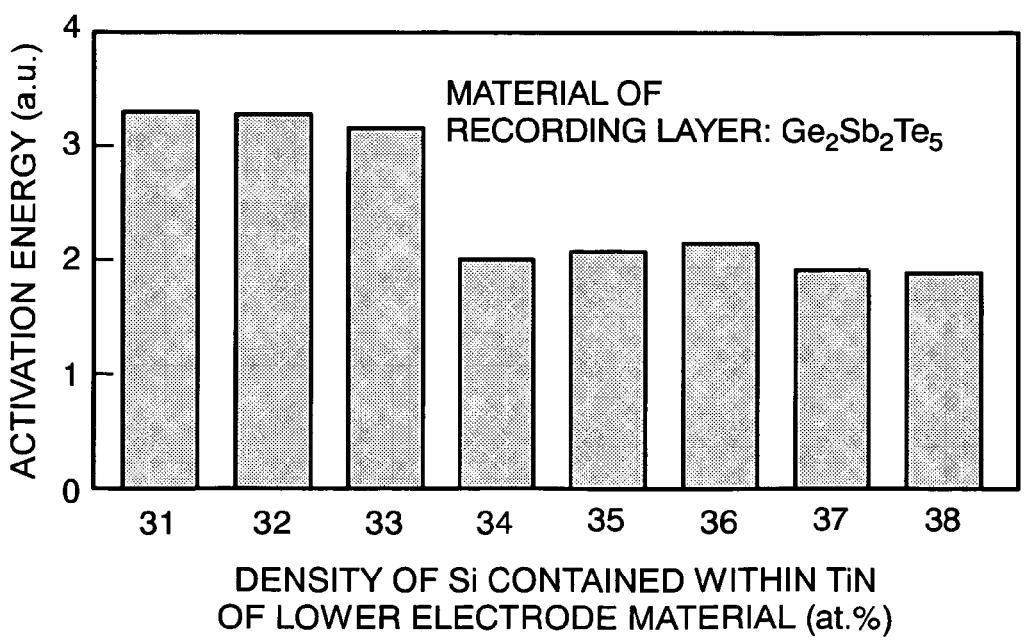
FIG. 6 is a graph for showing a manner of how activation energy, for changing from amorphous phase into crystal phase, depends on Si density within TiN, in case when applying $Ge_2Sb_2Te_5$ as the recoding film 104 and TiN as the lower electrode 102, in particular, within a high density region thereof.
Figure 7:
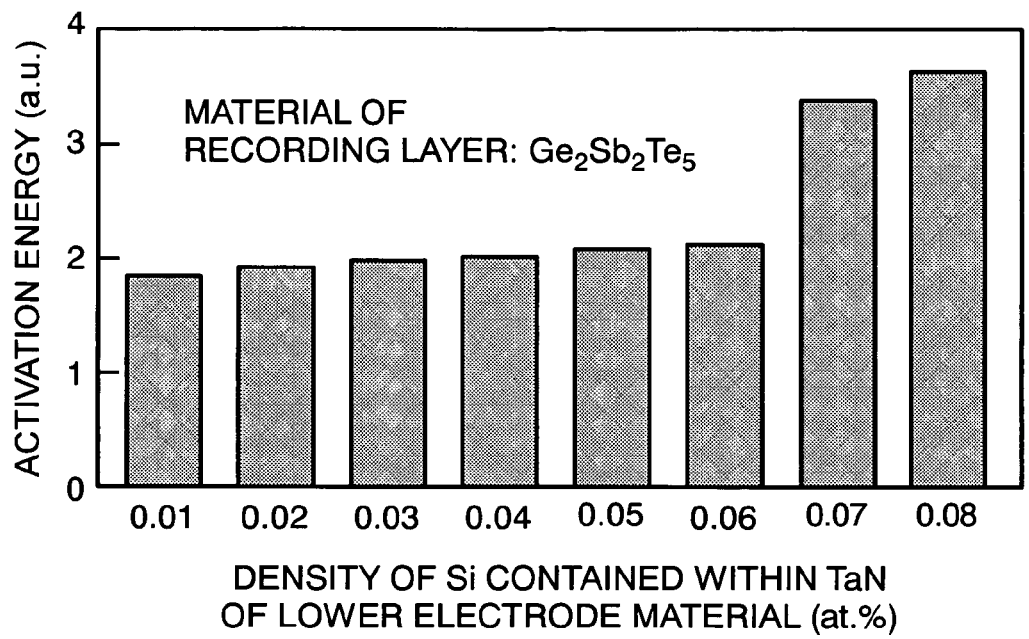
FIG. 7 is a graph for showing a manner of how activation energy, for changing from amorphous phase into crystal phase, depends on Si density within TaN, in case when applying $Ge_2Sb_2Te_5$ as a recoding film 104 and TaN as a lower electrode 102, in particular, within a low density region thereof.
Figure 8:
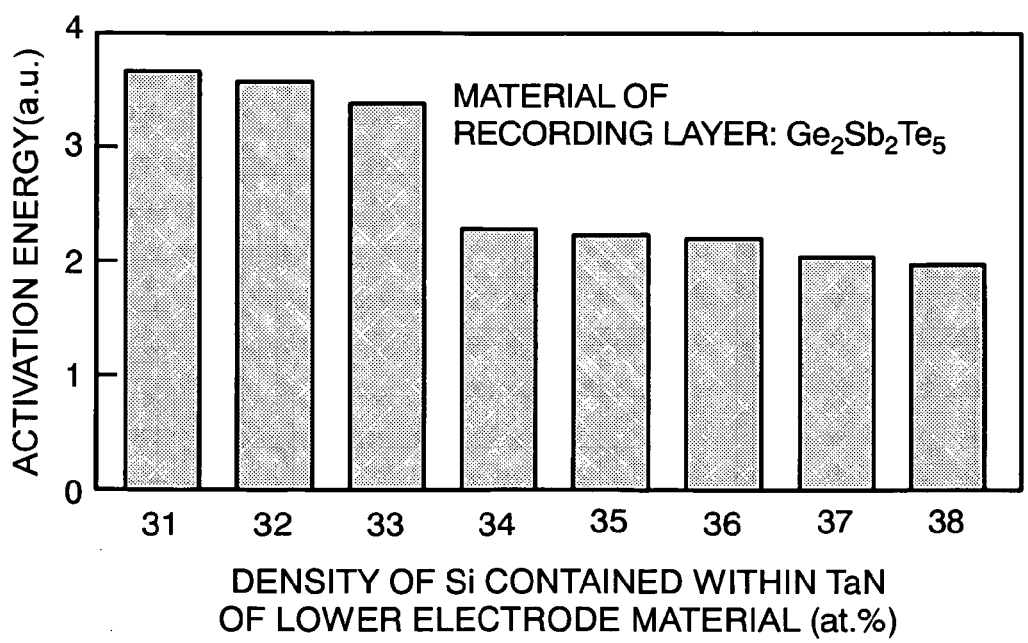
FIG. 8 is a graph for showing a manner of how activation energy, for changing from amorphous phase into crystal phase, depends on Si density within TaN, in case when applying $Ge_2Sb_2Te_5$ as the recoding film 104 and TaN as the lower electrode 102, in particular, within a high density region thereof.

A manner how the activation energy depends on the main constituent material of the lower electrode 102 is shown in FIG. 4, in particular, in case when ZnGeTe is applied as the main constituent material of the phase-charge recording layer 104. In the similar manner to the cases shown in FIGS. 2 and 3, it can be seen that the activation energy is remarkably large, when applying $TiSi_xN_y$ or $TaSi_xN_y$, being the amorphous material having the averaged distance of about 0.3 nm between the closest atoms within the surface of contact interface thereof, as a material of the lower electrode, and that the amorphous phase of the phase-change recording layer 104 is stabilized. And, further it can be seen that the effect of stabilization is high, comparing to the cases shown in FIGS. 2 and 3. Although not shown the results thereof, however it is confirmed through analysis that the effect of stabilizing the amorphous phase is high, when applying the element selected from Ge, Sb and Te to be the main constituent material, including at least two (2) elements therein, selected from Ge, Sb and Te, as well, and further including Zn as the constituent element therein.

With those examples given hereinbefore, there is shown the effect of stabilizing the amorphous phase, with applying the material of TiN being added with Si at 1 at. % as $TiSi_xN_y$, or the material of TaN being added with Si at 1 at. % is applied as $TaSi_xN_y$. Next, in which manner this effect depends on the density of Si is shown by referring to FIGS. 5, 6, 7 and 8. In the case where the density of Si is equal or greater than 0.07 at. % and equal or less than 33 at. %, the activation energy is large, and therefore it is high in the effect of stabilizing the amorphous phase of the phase-change recording layer 104. Accordingly, it is preferable to determine the density of Si to be within this range. The reason of this is as follows. Thus, since addition of Si being equal or greater than 0.05 at. % brings about an effect of turning TiN or TaN into the amorphous phase, easily, therefore it brings about an effect of stabilizing the amorphous phase of the phase-change recording layer 104. However, if Si is added to be equal or greater than 33 at. % in the density thereof, the averaged distance between the closest atoms within the surface of contact interface thereof comes to be smaller than about 0.3 nm, remarkable; therefore, the effect of stabilizing the amorphous phase of the phase-change recording layer 104 is weaken.

As is shown in FIG. 1, since there is a necessity of forming the lower electrode 102 having a narrow width in case where the width of the lower electrode 102 is smaller than that of the phase-change recording layer 104, then it is preferable to form the lower electrode 102 through the chemical vapor deposition (CVD) or the plating, from a viewpoint of manufacturing the fine electrode. Also, if the width of the lower electrode 102 is smaller than that of the phase-change recording layer 104, since the insulating layer 103 is in contact with the lower electrode 102, it is effective to apply the amorphous material, having the averaged distance of about 0.3 nm between the closest atoms within the surface of contact interface thereof, as the insulating layer 103, from a viewpoint of stabilizing the amorphous phases of the electrode 102 and the phase-change recording layer 104. The reason of this is same to that of stabilizing the amorphous phase of the phase-change recording layer 104 when applying the amorphous material, having the averaged distance of about 0.3 nm between the closest atoms within the surface of contact interface thereof, as the lower electrode 102, as was explained previously, by referring to FIGS. 2 to 4. Such amorphous materials, having the averaged distance of about 0.3 nm between the closest atoms within the surface of contact interface thereof, are $TiO_xN_y$ or $TaO_xO_yN_z$, $TiSi_xN_y$ or $TaSi_xO_yN_z$, for example, which can be applied as the insulating layer 103.

In the present embodiment, a Piezo element is formed, so as to let the phase-change recording layer 104 to have the tensile or stretching strain therein, for the purpose of increasing the rewriting function of the phase-change recording layer 104. This is because, it is possible to relax the stress caused when chaining the phase thereof, due to the tensile or stretching strain, and thereby increasing the tolerance against rewriting. And, since making the movement of atoms swift when the tensile or stretching strain causes the phase change within the phase-change recording layer 104, it also brings about an effect that the rewriting speed comes to be fast. In FIG. 1., the Piezo element has such the structure that the ferromagnetic layer 104p and the ferromagnetic layer 104q are sandwiched or inserted between the lower electrode 102 and the upper electrode layer 105.

Figure 9A:
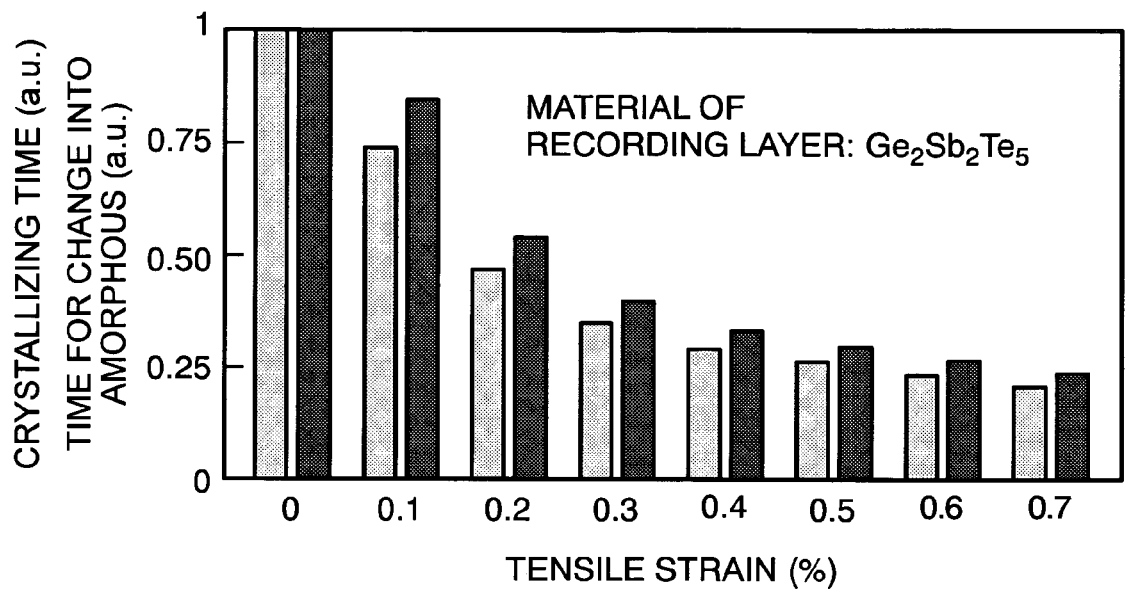
FIGS. 9(a) and 9(b) are graphs for showing an effect of the tensile or stretching strain in relation to time of phase change, respectively.
Figure 9B:
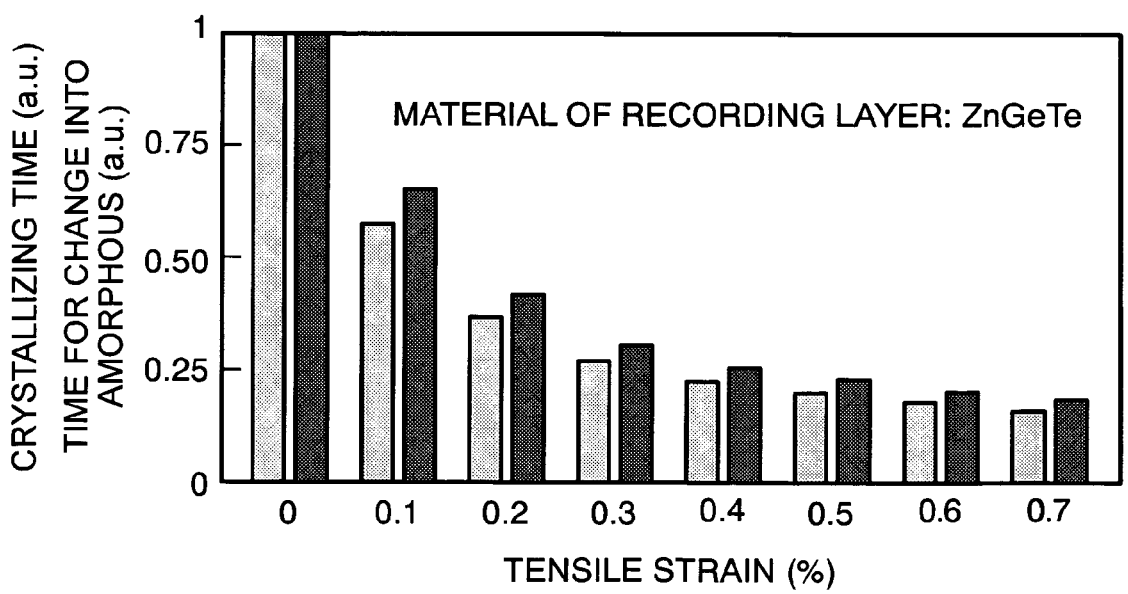

When causing the phase change by means of this Piezo element, i.e., when voltage is applied across the lower electrode 102 and the upper electrode layer 105, the tensile or stretching strain is applied to the phase-change recording layer 104. An effect of applying the tensile or stretching strain thereto is shown in FIGS. 9(a) and 9(b). Those FIGS. 9(a) and 9(b) show the time of phase change, in particular, in case of applying $Ge_2Sb_2Te_5$ and ZnGeTe as the main constituent material of the recording layer 104, respectively.

In FIGS. 9(a) and 9(b) are shown the time for crystallization and the time for changing into amorphous, by normalizing the value of zero (0) in the strain into one (1). A bar of thin gray indicates the time for crystallization and a bar of dark gray indicates the time for changing into amorphous. From those graphs, it can be seen that, when the tensile or stretching strain comes to be large, the time for crystallization and the time for changing into amorphous are shorten, and that the rewriting speed is fast. Though not shown in the figures, the similar effect can be obtained with other composition ratios.

Further, in this embodiment, it is preferable that the upper electrode layer 105 is a film or layer, which is formed passing through at least one of the oxidization process, the nitrization process and the oxidization/nitrization process, for the purpose of letting the phase-change recording layer 104 to have the tensile or stretching strain therein. This is because, the oxide and/or nitride intrudes into, through dealing the oxidization process, the nitrization process or the oxidization/nitrization process; therefore compression strain is applied into the upper electrode layer 105, and as a result thereof, the tensile or stretching strain acts upon the phase-change recording layer 104 lying below. In particular, in the case of the oxidization process, it is preferable that, as the upper electrode layer 105 is applied a $RuO_2$ film or layer, or a $IrO_2$ film or layer, though being an oxidization film but a conductor. Because, the upper electrode layer 105 cannot function thereof if not having the conductivity. Or, in the case of the nitrization process, it is preferable to apply TiN film or layer, or WN film or layer, etc., to be the upper electrode layer 105, though being an oxidization film but a conductor. This is also because the upper electrode layer 105 cannot function thereof if not having the conductivity.

Embodiment 2

Figure 10:
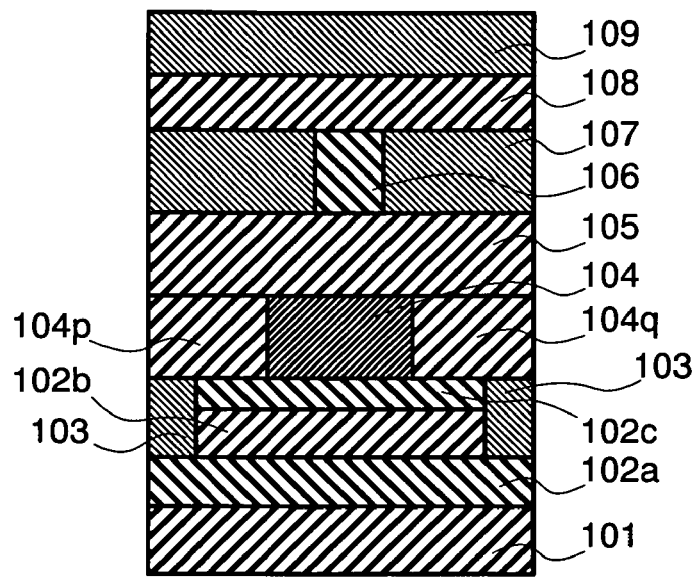
FIG. 10 is a cross-sectional view of a principle portion of a phase change memory, according to a second embodiment of the present invention.

Next, in FIG. 10 is shown the cross-sectional structure of a principle portion within the phase change memory, according to a second embodiment of the present invention. The difference thereof from the first embodiment lies in that the lower electrode 102 is built up with two (2) layers 102b and 102c in the structure thereof, in the second embodiment. In this case, for a first lower electrode 102b, it is preferable to select a material having good adherence with the wiring layer 102a, and for a second lower electrode 102c, it is preferable to apply an amorphous material, having the atomic arrangement similar to that in the amorphous phase of the phase-change recording layer 104, in particular, for the purpose of stabilizing the amorphous phase of the recording layer 104. Such amorphous materials, having the atomic arrangement similar to that of the amorphous phase of the recording layer 104, as well as, being preferable to be the material of the second lower electrode 102c, are $TiSi_xN_y$ and $TaSi_xN_y$, for example, as was mentioned above.

Embodiment 3

Figure 11:
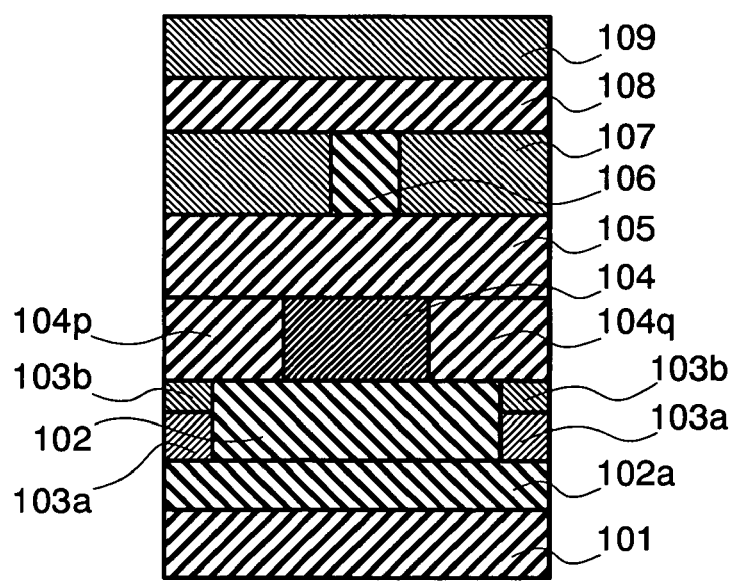
FIG. 11 is a cross-sectional view of a principle portion of a phase change memory, according to a third embodiment of the present invention.

Next, in FIG. 11 is shown the cross-sectional structure of a principle portion within the phase change memory, according to a third embodiment of the present invention. The difference thereof from the first embodiment lies in that the insulation layer 103 is built up with two (2) layers 103a and 103b in the structure thereof, in the third embodiment. In this case, for a first insulation layer 103a, it is preferable to select a material having good adherence with the wiring layer 102a, and for a second insulation layer 103b, it is preferable to apply an amorphous material, having the atomic arrangement similar to that in the amorphous phase of the phase-change recording layer 104, in particular, for the purpose of stabilizing the amorphous phases of the lower electrode 102 and the recording layer 104. Such amorphous materials, having the atomic arrangement similar to that of the amorphous phase of the recording layer 104, as well as, being preferable to be the material of the second insulation layer 103b, are $TiO_xN_y$, $TaO_xN_y$, $TiSi_xO_yN_z$, and $TaSi_xO_yN_z$, for example, as was mentioned above.

Figure 12:
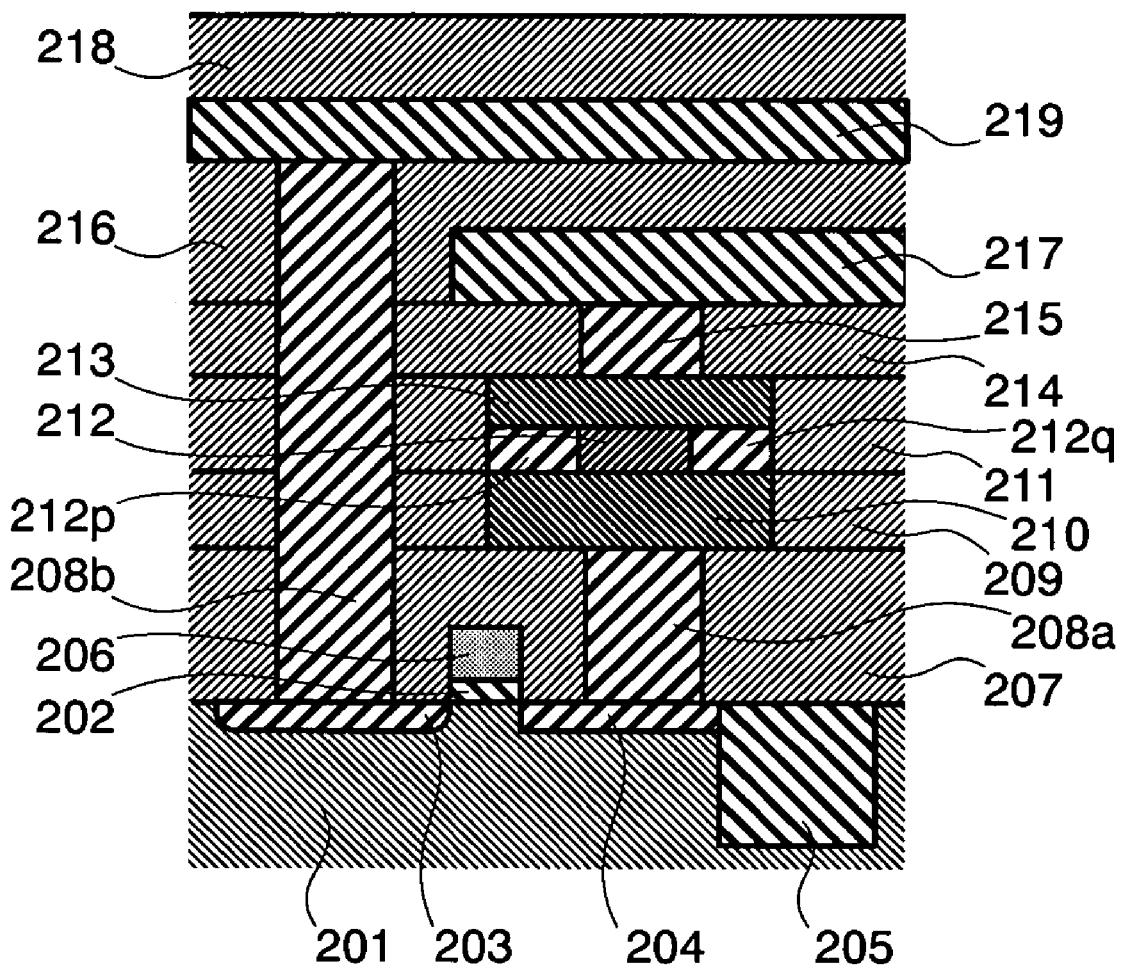
FIG. 12 is a cross-sectional view of a principle portion of the phase change memory, applying transistors therein for selecting a memory cell.
Figure 13:
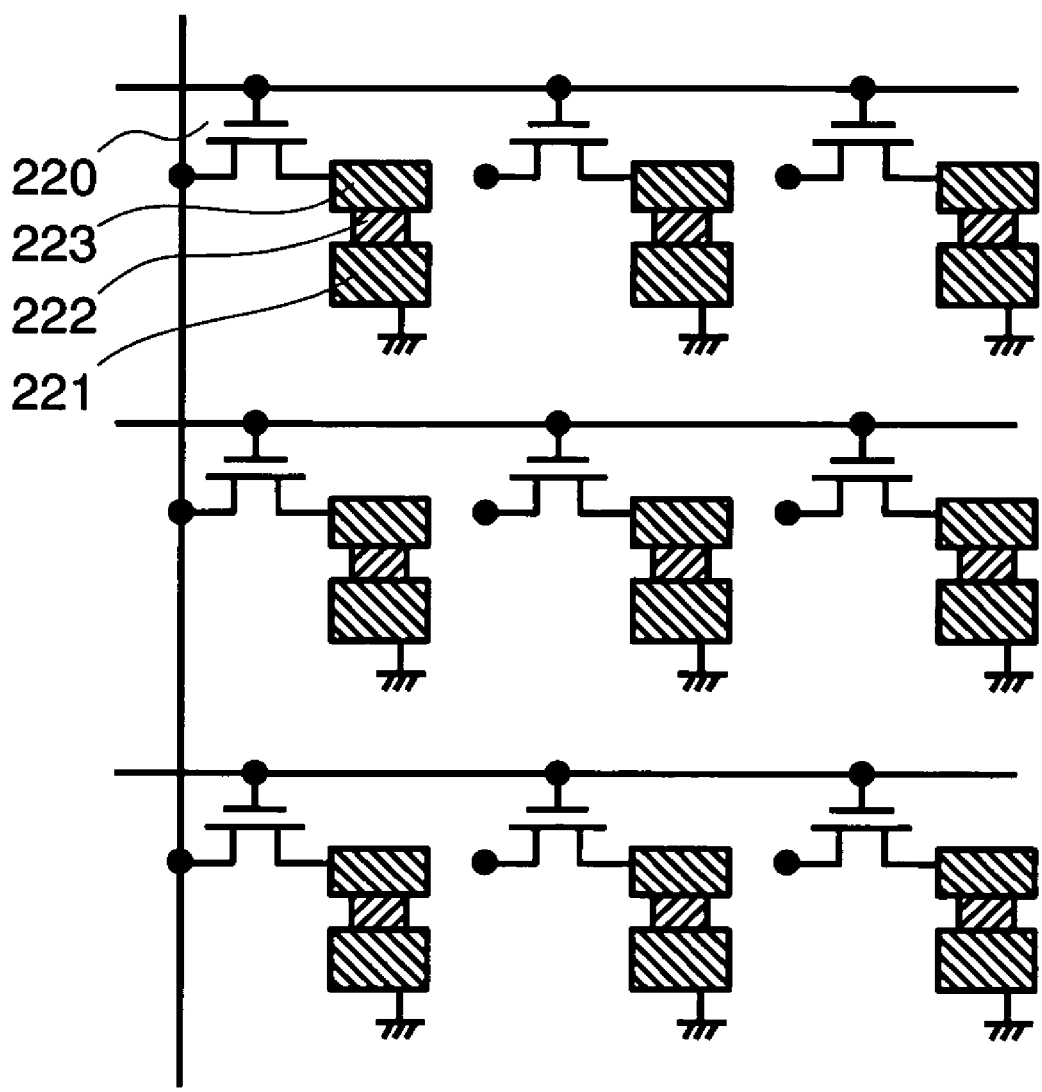
FIG. 13 is a circuitry diagram of the principle portion of the phase change memory, applying the transistors therein for selecting the memory cell.

Next, in FIG. 12 is shown the cross-sectional structure of the principle portion within the phase change memory, in which the layer structure of the embodiment mentioned above. In the phase change memory according to the present invention, a gate insulation layer 202 and a gate electrode 206 are formed on a silicon substrate 201, for example, for building up a transistor, and further wiring are formed on diffusion layers 203 and 204. The wirings 208a, 208b, 215, 217 and 219, the lower electrode 210, the phase-change recording layer 212, the ferromagnetic layers 212p and 212q, the upper electrode 213 are partitioned by the insulation layers 207, 209, 211, 214, 216 and 218. The Piezo element built up with the lower electrode 210, the ferromagnetic layers 212p and 212q, and the upper electrode 213 is provided for obtaining an effect of increasing the rewriting tolerance and the rewriting speed, in the similar manner to the first embodiment. In FIG. 12, the transistor, which is constructed with the gate electrode 206, the gate insulation layer 202 and the substrate 201, corresponds to one (1) piece of a transistor of such a memory circuit, as shown in FIG. 13, for example. For example, the electrodes 221 and 223 putting the phase-change recording layer 223 therebetween in FIG. 13 can be turned ON/OFF by the transistor 220, thereby being accessible to an address designated. Also, in the case where the width of the lower electrode 210 is smaller than that of the phase-change recording layer 212, since the insulation layer 209 is in contact with the lower electrode 210, therefore it is effective that the insulation layer 209 is made of an amorphous material, having the averaged distance of about 0.3 nm between the closest atoms within the surface of contact interface thereof, for the purpose of stabilizing the amorphous phases of the lower electrode and the phase-change recording layer 212.

Figure 14:
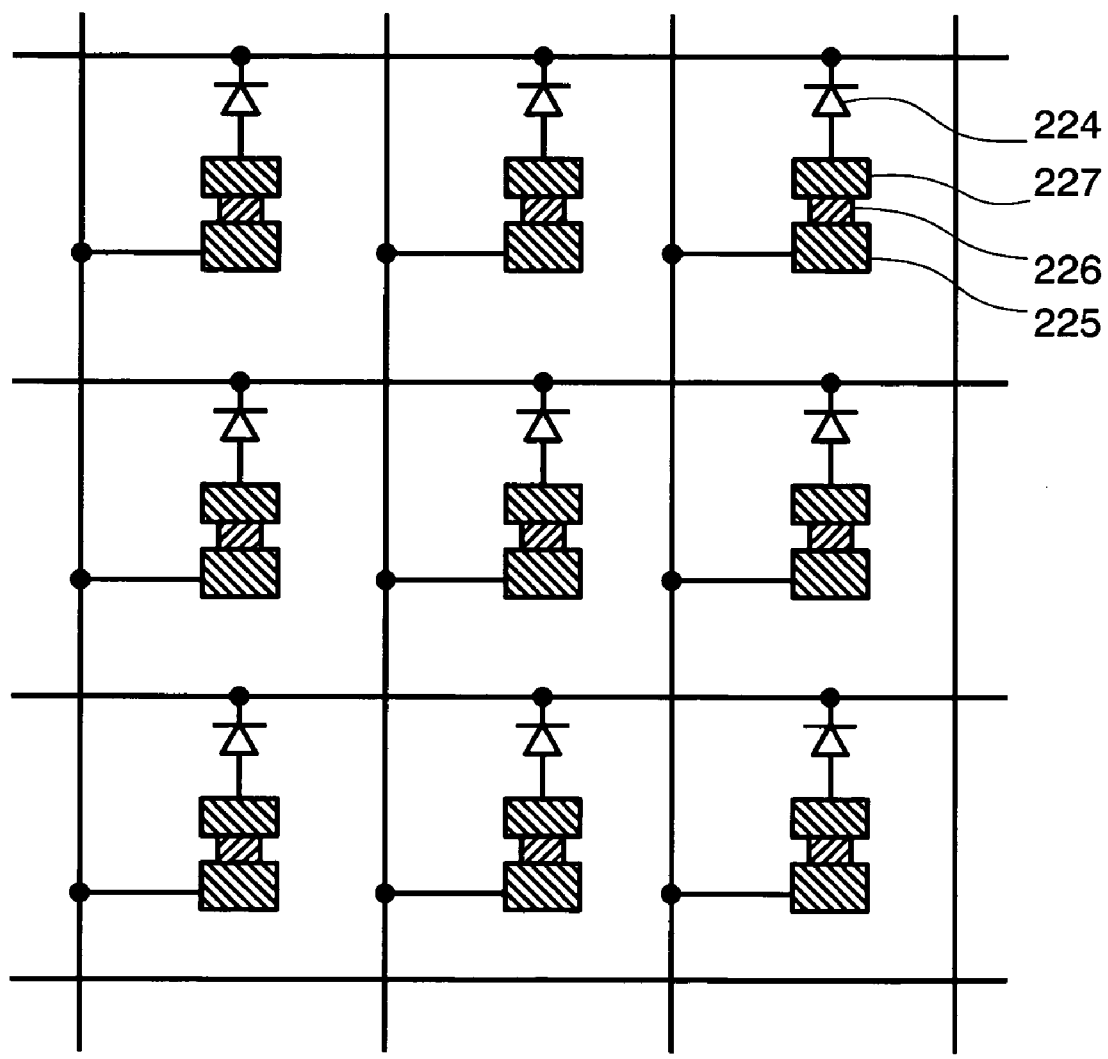
FIG. 14 is a cross-sectional view of a principle portion of the phase change memory, applying diodes therein for selecting a memory cell.

Also, in the place of the circuitry structure of applying the transistors therein, as is shown in FIG. 13, it may be so constructed that diodes 224 are applies therein for selecting the memory cells, as is shown in FIG. 14.

Figure 15:
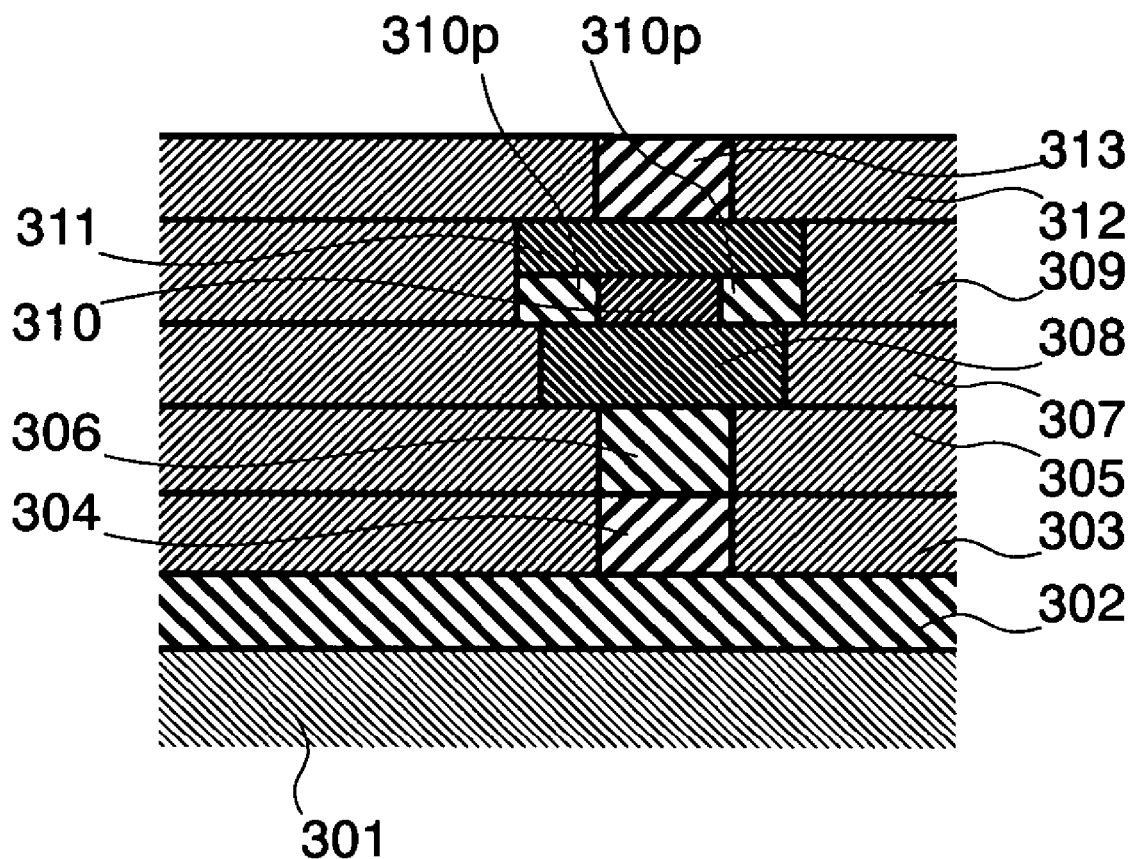
FIG. 15 is a circuitry diagram of the principle portion of the phase change memory, applying the diodes therein for selecting the memory cell.

An example of the cross-sectional structure is shown in FIG. 15. In the structure shown in FIG. 15, the wiring 302 is formed on the substrate 301, on which are formed semiconductor layers 303 and 305 of polycrystalline silicon, and further thereon are formed the insulation layer 307, the lower electrode 308, the insulation layer 309, the phase-change recording layer 310, the ferromagnetic layers 310p and 310q, the upper electrode 311, the insulation layer 312 and the wiring 313. The diode for electing the memory cell is built up, through forming $n^+$ region 304 by ion injection of n-type impurity into the semiconductor film or layer 303, while forming $p^+$ region 306 by ion injection of p-type impurity into the semiconductor film or layer 305, for example. Herein, as the material of the lower electrode 308, it is also preferable to apply the amorphous material, having the atomic arrangement similar to that in the amorphous phase of the phase-change recording layer 310, for the purpose of stabilizing the amorphous phase of the recording layer 310. The Piezo element, being built up with the lower electrode 308, the ferromagnetic layers 310p and 310q, and the upper electrode 311, is provided for the purpose of obtaining the effect of improving the rewriting tolerance and the rewriting speed, in the similar manner to that of the first embodiment.

Figure 16:
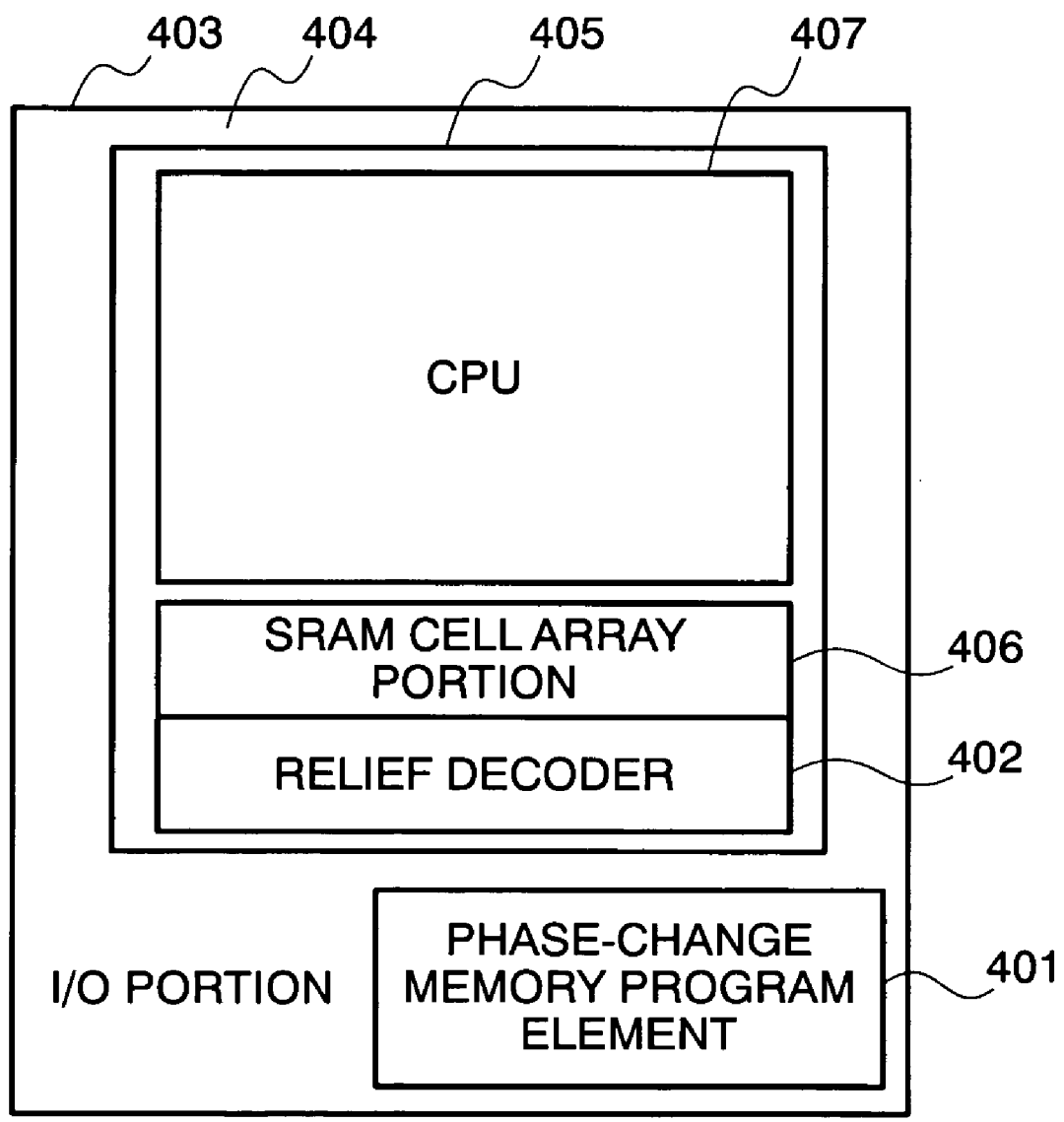
FIG. 16 is a block diagram of a chip of a SRAM memory equipped with a defect remedy or relief circuit.

Building up a semiconductor device by applying the phase change memory explained in the above-mentioned embodiments into a semiconductor device, having an arrangement for memorizing relief address information and/or trimming information within a non-volatile memory, such as, a flash memory, for example, it is possible to obtain a highly reliable one, which has the effect mentioned above, as well. An example of such the semiconductor device is shown in FIG. 16. This example shows a SRAM memory equipped with a defect relief circuit therein. In FIG. 16, a reference numeral 403 depicts a chip, 401 a phase change memory as a program element, 402 a relief decoder, 404 an input/output circuit portion (I/O portion), and 405 a core portion, respectively. Within the core portion, there is included a CPU 407 and a SRAM cell array portion 406. It is preferable that the phase change memory program element 401 lies within the I/O portion 404, for reducing an area thereof.

Further, in the specification, the main constituent material or element means the material existing at the maximum density therein. Also, for example, the accurate ratio of composition of $GeSb_2Te_4$ is Ge:Sb:Te=1:2:4, however it can be considered to be substantially equivalent if it is within 10%, such as, 1:2.2:4, for example.

The present invention can be applied into an information-recording device, in the form of the phase change memory.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A phase change memory, comprising:
   a phase-change recording layer for recording information through changing between a crystal phase and an amorphous phase; and
   a means for applying a tensile strain onto said phase-change recording layer;

wherein said phase-change recording layer includes at least two selected from Ge, Sb and Te, as a constituent element thereof; and wherein said means for applying a tensile strain is a Piezo element.

2. The phase change memory, as is described in the claim 1, wherein said Piezo element has first and second ferromagnetic layers putting said phase-change recording layer therebetween, and said phase-change memory further comprises first and second electrodes, said first and second electrodes putting said phase-change recording layer and said first and second ferromagnetic layers therebetween.

3. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, a main constituent material of said first electrode is $TiSi_xN_y$ or $TaSi_xN_y$, Si density within said first electrode is equal or greater than 0.07 at. % and equal or less than 33 at. %, and a ferromagnetic layer is put between said first electrode and said second electrode in structure thereof.

4. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, a main constituent material of said first electrode is $TiSi_xN_y$ or $TaSi_xN_y$, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, and a ferromagnetic layer is put between said first electrode and said second electrode in structure thereof.

5. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, a main constituent material of said first electrode is $TiSi_xN_y$ or $TaSi_xN_y$ formed through a chemical vapor deposition method or a plating method, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, and a ferromagnetic layer is put between said first electrode and said second electrode in structure thereof.

6. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, a main constituent material of said first electrode is $TiSi_xN_y$ or $TaSi_xN_y$, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, said second electrode is a layer, being formed through treating at least one of an oxidization process, a nitrization process and an oxidization/nitrization process thereon, and a ferromagnetic layer is put between said first electrode and said second electrode in structure thereof.

7. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, a main constituent material of said first electrode is $TiSi_xN_y$ or $TaSi_xN_y$ formed through a chemical vapor deposition method or a plating method, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, said second electrode is a layer, being formed through treating at least one of an oxidization process, a nitrization process and an oxidization/nitrization process thereon, and a ferromagnetic layer is put between said first electrode and said second electrode in structure thereof.

8. A phase change memory, comprising:

a substrate;

a dielectric layer formed on one main surface of said substrate;

a first electrode formed in contact with said dielectric layer; and a phase-change recording layer formed in contact with said first electrode;

a second electrode formed in contact with said phase-change recording layer, wherein said phase-change recording layer includes at least two selected from Ge, Sb and Te, as a constituent element thereof, said phase-change recording layer includes Zn as a constituent element thereof, a main constituent material of said first electrode is $TiSi_xN_y$ or $TaSi_xN_y$, Si density within said first electrode is equal or greater than 0.07 at. % and equal or less than 33 at. %, and a ferromagnetic layer is put between said first electrode and said second electrode in structure thereof.

9. A phase change memory, comprising:
a substrate;
a dielectric layer formed on one main surface of said substrate;
a first electrode formed in contact with said dielectric layer; and
a phase-change recording layer formed in contact with said first electrode;
a second electrode formed in contact with said phase-change recording layer, wherein said phase-change recording layer includes at least two selected from Ge, Sb and Te, as a constituent element thereof, a main constituent material of said phase-change recording layer is $ZnSb_xTe_y$, or $ZnGe_xTe_y$, or $ZnGe_xSb_yTe_z$ or $GeSb_xTe_y$, a main constituent material of said first electrode is $TiSi_xN_y$, or $TaSi_xN_y$, Si density within said first electrode is equal or greater than 0.07 at. % and equal or less than 33 at. %, and a ferromagnetic layer is put between said first electrode and said second electrode in structure thereof.

10. A phase change memory, comprising:
a substrate;
a dielectric layer formed on one main surface of said substrate;
a first electrode formed in contact with said dielectric layer; and
a phase-change recording layer formed in contact with said first electrode;
a second electrode formed in contact with said phase-change recording layer, wherein said phase-change recording layer includes at least two selected from Ge, Sb and Te, as a constituent element thereof, a main constituent material of said phase-change recording layer is $ZnSb_xTe_y$, or $ZnGe_xTe_y$, or $ZnGe_xSb_yTe_z$ or $GeSb_xTe_y$, a main constituent material of said first electrode is $TiSi_xN_y$, or $TaSi_xN_y$, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, and a ferromagnetic layer is put between said first electrode and said second electrode in structure thereof.

11. A phase change memory, comprising:
a substrate;
a dielectric layer formed on one main surface of said substrate;
a first electrode formed in contact with said dielectric layer; and
a phase-change recording layer formed in contact with said first electrode;
a second electrode formed in contact with said phase-change recording layer, wherein said phase-change recording layer includes at least two selected from Ge, Sb and Te, as a constituent element thereof, a main constituent material of said phase-change recording layer is $ZnSb_xTe_y$, or $ZnGe_xTe_y$, or $ZnGe_xSb_yTe_z$ or $GeSb_xTe_y$, a main constituent material of said first electrode is $TiSi_xN_y$ or $TaSi_xN_y$ formed through a chemical vapor deposition method or a plating method, Si density within said first electrode is equal or greater than 0.07 at. % and equal or less than 33 at. %, a main constituent material of said dielectric layer is $TiO_xN_y$, or $TaO_xN_y$, or $TaO_xN_y$, or $TiSi_xO_yN_z$ or $TaSi_xO_yN_z$, and a ferromagnetic layer is put between said first electrode and said second electrode in structure thereof.

12. A phase change memory, comprising:
a substrate;
a dielectric layer formed on one main surface of said substrate;
a first electrode formed in contact with said dielectric layer; and
a phase-change recording layer formed in contact with said first electrode;
a second electrode formed in contact with said phase-change recording layer, wherein said phase-change recording layer includes at least two selected from Ge, Sb and Te, as a constituent element thereof, a main constituent material of said phase-change recording layer is $ZnSb_xTe_y$, or $ZnGe_xTe_y$, or $ZnGe_xSb_yTe_z$ or $GeSb_xTe_y$, a main constituent material of said first electrode is $TiSi_xN_y$ or $TaSi_xN_y$ formed through a chemical vapor deposition method or a plating method, Si density within said first electrode is equal or greater than 0.07 at. % and equal or less than 33 at. %, a main constituent material of said dielectric layer is $TiO_xN_y$ or $TaO_xN_y$ or $TaO_xN_y$ or $TiSi_xO_yN_z$ or $TaSi_xO_yN_z$, said second electrode is a layer, being formed through treating at least one of an oxidization process, a nitrization process and an oxidization/nitrization process thereon, and a ferromagnetic layer is put between said first electrode and said second electrode in structure thereof.

* * * * *